United States Patent
Wang et al.

(10) Patent No.: US 12,018,389 B2
(45) Date of Patent: Jun. 25, 2024

(54) SURFACE TREATMENT METHOD FOR MAGNESIUM ALLOY OBJECT AND STRUCTURE THEREOF

(71) Applicant: Ju Teng International Holdings Ltd., Hong Kong (HK)

(72) Inventors: Hsiang-Jui Wang, Taipei (TW); Shun-Jie Yang, Taipei (TW); Cheng-Ping Hsiao, Taipei (TW)

(73) Assignee: JU TENG INTERNATIONAL HOLDINGS LTD., Hong Kong (HK)

( * ) Notice: Subject to any disclaimer, the term of this patent is extended or adjusted under 35 U.S.C. 154(b) by 854 days.

(21) Appl. No.: 16/926,241

(22) Filed: Jul. 10, 2020

(65) Prior Publication Data

US 2022/0010435 A1    Jan. 13, 2022

(51) Int. Cl.
| | |
|---|---|
| *C23C 8/10* | (2006.01) |
| *C23C 22/57* | (2006.01) |
| *C23F 17/00* | (2006.01) |
| *C25D 11/30* | (2006.01) |
| *C23C 22/82* | (2006.01) |
| *C23C 28/00* | (2006.01) |

(52) U.S. Cl.
CPC .............. *C23F 17/00* (2013.01); *C25D 11/30* (2013.01)

(58) Field of Classification Search
CPC ........ B05D 1/04; B05D 1/18; B05D 2202/15; B05D 2202/20; B05D 2202/35; B05D 3/142; B05D 7/50–51; C25D 11/026; C25D 11/30; C25D 13/12; C25F 17/00; C09D 5/08; C23C 8/10–18
See application file for complete search history.

(56) References Cited

U.S. PATENT DOCUMENTS

2015/0284836 A1*  10/2015  Liu ................ C25D 11/246
                                                     204/192.15

* cited by examiner

*Primary Examiner* — Lois L Zheng
(74) *Attorney, Agent, or Firm* — MUNCY, GEISSLER, OLDS & LOWE, P.C.

(57) ABSTRACT

The present invention provides a surface treatment method for magnesium alloy object, the method comprising: providing a magnesium alloy object; preprocessing the magnesium alloy object; performing micro-arc oxidation (MAO) treatment on the magnesium alloy object to form a micro-arc oxidation layer; Sputtering at least one metal layer or at least one non-metal layer on a surface of the micro-arc oxidation layer, the metal layer or non-metal layer which is sputtered on the micro-arc oxidation layer has different angles by using surface roughness of the micro-arc oxidation layer when a light source is projected on the metal layer or non-metal layer; and Sputtering a paint layer on the metal layer or non-metal layer to make the surface metallic lustrous and corrosion-resistant. The present invention further provides a surface structure of a magnesium alloy object.

7 Claims, 4 Drawing Sheets

SURFACE TREATMENT METHOD FOR MAGNESIUM ALLOY OBJECT AND STRUCTURE THEREOF

BACKGROUND OF THE INVENTION

1. Technical Field

The present invention relates to surface treatment method for magnesium alloy object and structure thereof.

2. Description of Prior Art

The casing/shell of the electronic devices may include a plurality of structural elements. For example, the laptop computer may include display and main body. The display may include upper cover and display main body, while the main body may include keyboard cover and bottom structure. The main body and keyboard cover mentioned above may contain any suitable material.

The casing/shell of the electronic devices, such as casing of portable electronic devices, can be in frequent contact with other objects such as table, user hand, ground, magnesium alloy object such that the casing/shell of the electronic devices may have deformation. The casing/shell can be damaged, the cover paint of the casing/shell can be worn out and the protection layer can be broken due to collision or rub. The metallic object on casing/shell of the electronic devices can be rust-eaten such that it cannot provide protection function and is not appealing for consumer for appearance.

Although the shell is adopted to a metallic magnesium alloy product, however, the metallic magnesium alloy is used by electroplating metal material on the surface of the magnesium alloy with a electroplating method in general. It is not easy to treat a magnesium alloy surface electroplating process due to chemical property of magnesium is actively chemically in the magnesium alloy in general. Therefore, the magnesium alloy surface needs be treated by passivation treatment and the manufacturing process is complicated.

SUMMARY OF THE INVENTION

The object of the present invention is to provide surface of magnesium alloy object with metallic lustrous and corrosion-resistant.

The present invention provides a surface treatment method for magnesium alloy object, which comprises: providing a magnesium alloy object; preprocessing the magnesium alloy object; performing micro-arc oxidation (MAO) treatment on the magnesium alloy object to form a micro-arc oxidation layer; sputtering at least one metal layer or at least one non-metal layer on a surface of the micro-arc oxidation layer, the metal layer or non-metal layer which is sputtered on the micro-arc oxidation layer has different angles by using surface roughness of the micro-arc oxidation layer when a light source is projected on the metal layer or non-metal layer; and spraying a paint layer on the metal layer or non-metal layer to make the surface metallic lustrous and corrosion-resistant.

Wherein the micro-arc oxidation layer can be a passivation layer for enhancing the capability of corrosion-resistance. Meanwhile, the surface of the micro-arc oxidation layer can be an imitation-aluminum alloy surface. The surface of the micro-arc oxidation layer has irregular holes with surface roughness Ra 0.5~2 um.

Wherein the metal layer includes aluminum/stainless steel/titanium. The non-metal layer includes titanium oxide, titanium oxynitride or silicon oxide.

Wherein the metal layer or non-metal layer which is sputtered on the micro-arc oxidation layer has different reflect angles when a light source is projected thereon, and the different reflect angles is 0 to 180 degrees.

Wherein the paint layer can be a resin which has ability to enhance the corrosion resistance/scratch resistance. The paint layer can be a transparent or matte paint layer.

The first embodiment of the present invention further provides a surface structure of magnesium alloy object, comprising: a substrate, a micro-arc oxidation layer arranged on the substrate, the micro-arc oxidation layer has a rough surface, a metal layer or non-metal layer arranged on the micro-arc oxidation layer; and a paint layer arranged on the metal layer or non-metal layer.

Wherein the micro-arc oxidation layer can be a passivation layer for enhancing the capability of corrosion-resistance. Meanwhile, the surface of the micro-arc oxidation layer may can an imitation-aluminum alloy surface. The surface of the micro-arc oxidation layer has irregular holes with surface roughness Ra 0.5~2 um.

Wherein the metal layer includes aluminum/stainless steel/titanium. The non-metal layer includes titanium oxide, titanium oxynitride or silicon oxide.

Wherein the metal layer or non-metal layer which is sputtered on the micro-arc oxidation layer has different reflect angles when a light source is projected thereon, and the different reflect angles is 0 to 180 degrees.

Wherein the paint layer can be a resin which has ability to enhance the corrosion resistance/scratch resistance. The paint layer can be a transparent or matte paint layer.

The second embodiment of the present invention provides a surface treatment method for magnesium alloy object, the method comprising: providing a magnesium alloy object; preprocessing the magnesium alloy object; performing micro-arc oxidation treatment on the magnesium alloy object to form a micro-arc oxidation layer; forming a coat layer as a seal layer of the micro-arc oxidation layer by using electro-coating (ED) treatment or solution dipping method or spraying, meanwhile sputtering at least one metal layer or non-metal layer on the coat layer by using appearance characteristic of the coat layer; and spraying a paint layer on the metal layer or non-metal layer.

Wherein the micro-arc oxidation layer can be a passivation layer for enhancing the capability of corrosion-resistance. Meanwhile, the surface of the micro-arc oxidation layer may can an imitation-aluminum alloy surface. The surface of the micro-arc oxidation layer has irregular holes with surface roughness Ra 0.5~2 um.

Wherein the metal layer includes aluminum/stainless steel/titanium. The non-metal layer includes titanium oxide, titanium oxynitride or silicon oxide.

Wherein the metal layer or non-metal layer which is sputtered on the micro-arc oxidation layer has different reflect angles when a light source is projected thereon, and the different reflect angles is 0 to 180 degrees.

Wherein the paint layer can be a resin which has ability to enhance the corrosion resistance/scratch resistance. The paint layer can be a transparent or matte paint layer.

Wherein a solution in the solution dipping method can be a Water-based siloxane resin.

The second embodiment of the present invention further provides a surface structure of magnesium alloy object, comprising: a substrate; a micro-arc oxidation layer arranged on the substrate, the micro-arc oxidation layer has an rough surface; at least one metal layer or at least one non-metal layer arranged on the micro-arc oxidation layer; a coat layer arranged on the metal layer or non-metal layer, a paint layer arranged on the coat layer.

Wherein the micro-arc oxidation layer can be a passivation layer for enhancing the capability of corrosion-resistance. Meanwhile, the surface of the micro-arc oxidation layer can be an imitation-aluminum alloy surface. The surface of the micro-arc oxidation layer has irregular holes with surface roughness Ra 0.5~2 um.

Wherein the metal layer includes aluminum/stainless steel/titanium. The non-metal layer includes titanium oxide, titanium oxynitride or silicon oxide.

Wherein the metal layer or non-metal layer which is sputtered on the micro-arc oxidation layer has different reflect angles when a light source is projected thereon, and the different reflect angles is 0 to 180 degrees.

Wherein the paint layer can be a resin which has ability to enhance the corrosion resistance/scratch resistance. The paint layer can be a transparent or matte paint layer The magnesium alloy object according to the present invention is subject to achieve corrosion protection by sputtering at least one metal layer or at least one non-metal layer and transparent or matte paint layer on the micro-arc oxidation layer after micro-arc oxidation (MAO) treatment.

DETAILED DESCRIPTION OF THE INVENTION

Figure 1:
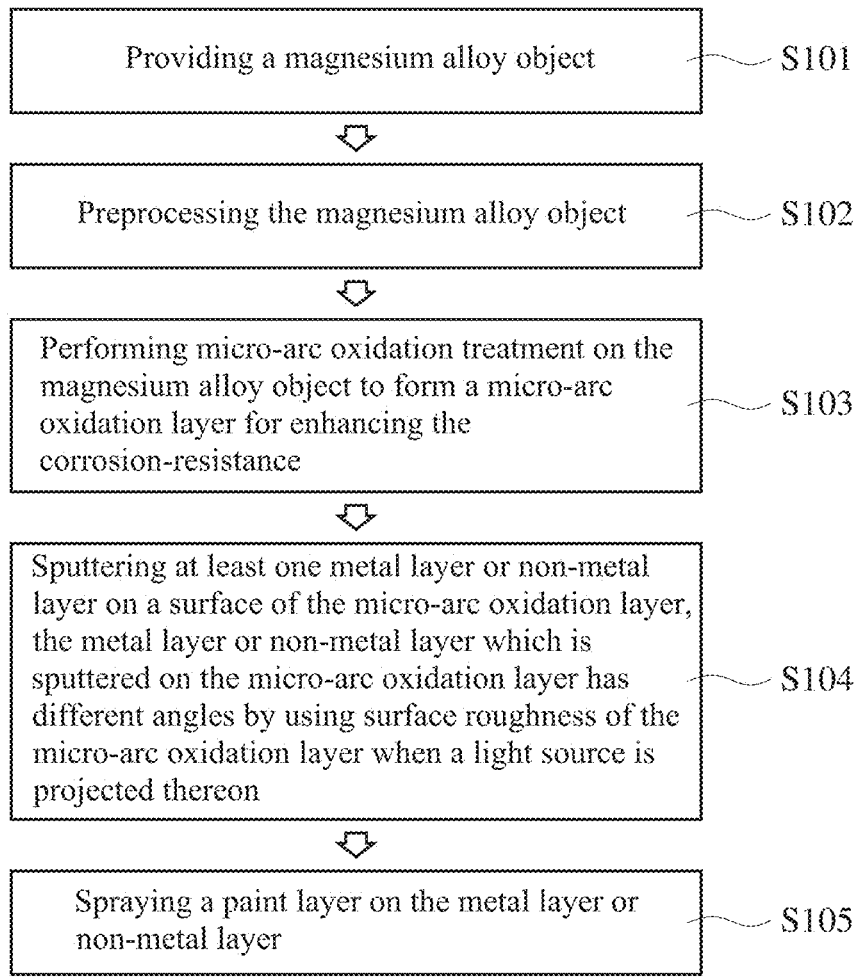
FIG. 1 shows the treatment steps according to the first embodiment of the present invention.

Reference will now be made to the drawing figures to describe the present disclosure in detail. It will be understood that the drawing figures and exemplified example of present disclosure are not limited to the details thereof.

The Definition of the treatment method in the present invention are described as following:

Micro-Arc Oxidation (MAO):

Micro-arc oxidation (MAO) is also referred to as plasma electrolytic oxidation and can form oxide coating on conductive material such as metallic material. The "metallic material" is referred to as pure metal, metal alloy, intermetallic or compound containing metal. The metallic material may include aluminum, magnesium, titanium and so on. MAO adopts high electric potential to discharge and the resulting plasma may change the structure property of the oxide layer.

MAO establishes minute discharge on the surface of the metallic material dipped in electrolyte. MAO treatment forms relatively thick and substantially crystallized oxide coating. The thickness of the coating layer is, for example, tens or hundreds of micrometer, but it is not limited to specific values. For example, in compliance of various application and arts, the MAO coating may have larger or smaller thickness. The resulting MAO oxide coating is compact and/or extensible and has relatively high hardness, which is in contrary to the oxide layer formed by anode oxidation.

On contrary to deposition treatment, MAO is chemical conversion technique. The oxide layer formed by MAO process is resulted from the oxidation of the lower metallic layer, which is not oxide layer formed by deposited layer on object. In comparison with deposition processing (such as Sputtering), MAO coating layer has higher adhesion to the lower layer metal material.

Electro-Coating (ED):

Electro-coating (ED) utilizes external electric field to deposit pigment in electrophoresis solution to surface of the magnesium alloy object. ED has the advantages of water-soluble, non-toxic, easy to automatic control and so on, and is extensively applied to automobile, building materials, hardware and home electronic appliance. The principle of ED is described as follows. The resin in the cathode electrophoresis coating has alkaline base group and forms salt soluble to water after reacted with acid. After applying DC current, the acid negative ions move toward anode and the resin ions (with the pigment particles wrapped therein) with positive charge moves toward cathode and then deposit on the cathode. This is the principle of ED and therefore it is also referred to as plating-painting. ED is a complicated electrochemistry reaction and includes four reactions (electrophoresis, electro-plating, electrolyze and electroosmosis) occurring at the same time.

The electro-coating (ED) has advantages of plentiful, uniform, smooth and shining coating. The hardness, bonding, corrosion-resisting, shock-resisting and porousness of ED layer is better than that of the other coating layer.

Manufacturing Method:

At least one part of the shell structure disclosed here can be manufactured by steps of arbitrary number. FIG. 1 shows exemplary steps for this manufacturing method. The method shown in FIG. 1 includes processing a first surface of the metallic material by micro-arc oxidation (MAO) treatment (S101). The oxidation technology can involve any suitable and various process. Depending on the involved material and skill, any suitable oxidation parameter can be used.

Refer to FIG. 1, the steps in a surface treatment method for magnesium alloy object, which comprises: providing a magnesium alloy object (S101). Preprocessing the magnesium alloy object (S102). Performing micro-arc oxidation (MAO) treatment on the magnesium alloy object to form a micro-arc oxidation layer (S103). Sputtering at least one metal layer or at least one non-metal layer on a surface of the micro-arc oxidation layer, the metal layer or non-metal layer which is sputtered on the micro-arc oxidation layer has different angles by using surface roughness of the micro-arc oxidation layer when a light source is projected on the metal layer or non-metal layer (S104). And spraying a paint layer on the metal layer or non-metal layer (S105) to make the surface metallic lustrous and corrosion-resistant.

Wherein the preprocessing step comprises removing the dust particle and oil stain.

Wherein the micro-arc oxidation layer can be a passivation layer for enhancing the capability of corrosion-resistance. Meanwhile, the surface of the micro-arc oxidation layer can be an imitation-aluminum alloy surface. The surface of the micro-arc oxidation layer has irregular holes with surface roughness Ra 0.5~2 um.

Wherein the metal layer includes aluminum/stainless steel/titanium. The non-metal layer includes titanium oxide, titanium oxynitride or silicon oxide.

Wherein the metal layer or non-metal layer which is sputtered on the micro-arc oxidation layer has different reflect angles when a light source is projected thereon, and the different reflect angles is 0 to 180 degrees.

Wherein the paint layer can be a resin which has ability to enhance the corrosion resistance/scratch resistance. The paint layer can be a transparent or matte paint layer. The transparent paint layer includes ability of anti-fingerprint or organic paint in order to protect the sputtering layer.

In one embodiment, one of the metal layer and the non-metal layer in the present invention is arranged on the micro-arc oxidation layer.

In one embodiment, the metal layer and the non-metal layer in the present invention are arranged on the micro-arc oxidation layer in sequence.

In one embodiment, the non-metal layer and the non-metal layer in the present invention are arranged on the micro-arc oxidation layer.

In one embodiment, the metal layer and the metal layer in the present invention are arranged on the micro-arc oxidation layer.

Figure 2:
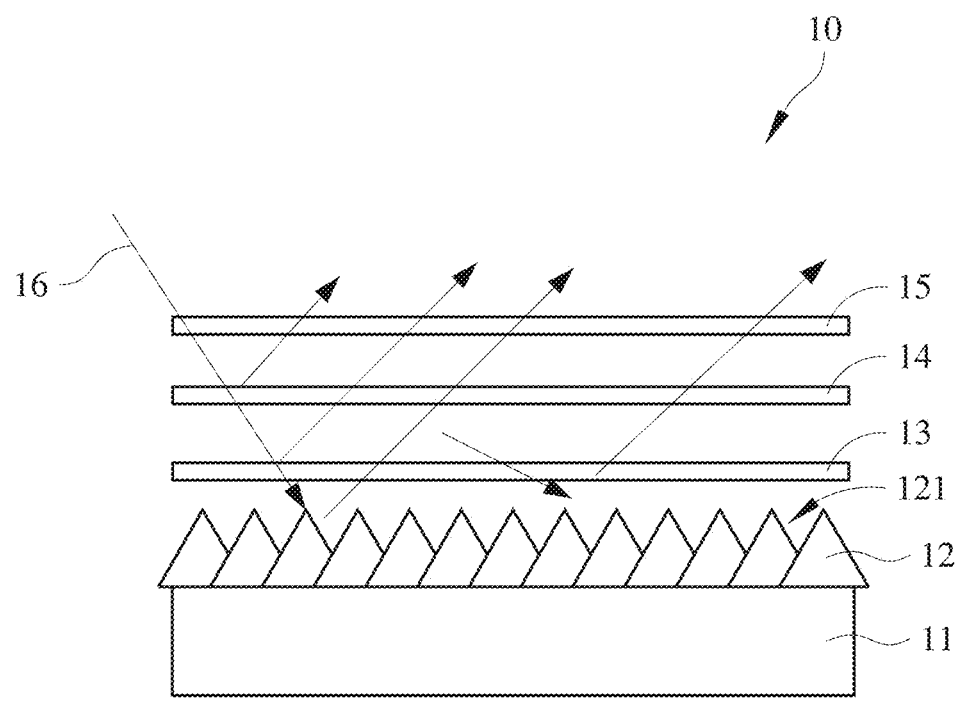
FIG. 2 shows the view of structure according to the first embodiment of the present invention.

Refer to FIG. 2, the first embodiment of the present invention further provides a surface structure 10 of the magnesium alloy object, comprising: a substrate 11, a micro-arc oxidation layer 12 arranged on the substrate 11, the micro-arc oxidation layer 12 has a rough surface 121, a metal layer 13 or non-metal layer 14 is arranged on the micro-arc oxidation layer 12, a paint layer 15 arranged on the metal layer 13 or non-metal layer 14. Wherein, the substrate can be a magnesium alloy object. As shown in FIG. 2, the metal layer 13 or non-metal layer 14 is sputtered on the micro-arc oxidation layer 12 respectively. Alternatively, the metal layer 13 and non-metal layer 14 are sputtered on the micro-arc oxidation layer 12 respectively.

Wherein the micro-arc oxidation layer 12 can be a passivation layer for enhancing the capability of corrosion-resistance. Meanwhile, the surface of the micro-arc oxidation layer 12 can be an imitation-aluminum alloy surface. The surface 121 of the micro-arc oxidation layer 12 has irregular holes with surface roughness Ra 0.5~2 um.

Wherein the metal layer includes aluminum/stainless steel/titanium. The non-metal layer includes titanium oxide, titanium oxynitride or silicon oxide.

Wherein the metal layer or non-metal layer which is sputtered on the micro-arc oxidation layer 12 has different reflect angles when a light source 16 is projected thereon, and the different reflect angles is 0 to 180 degrees.

Wherein the paint layer 15 can be a resin which has ability to enhance the corrosion resistance/scratch resistance. The paint layer can be a transparent or matte paint layer. The transparent paint layer includes ability of anti-fingerprint or organic paint in order to protect the sputtering layer.

In one embodiment, one of the metal layer 13 and the non-metal layer 14 in the present invention is arranged on the micro-arc oxidation layer 12.

In one embodiment, the metal layer 13 and the non-metal layer 14 in the present invention are arranged on the micro-arc oxidation layer 12 in sequence.

In one embodiment, the non-metal layer 14 and the non-metal layer 14 in the present invention are arranged on the micro-arc oxidation layer.

In one embodiment, the metal layer 13 and the metal layer 13 in the present invention are arranged on the micro-arc oxidation layer.

Figure 3:
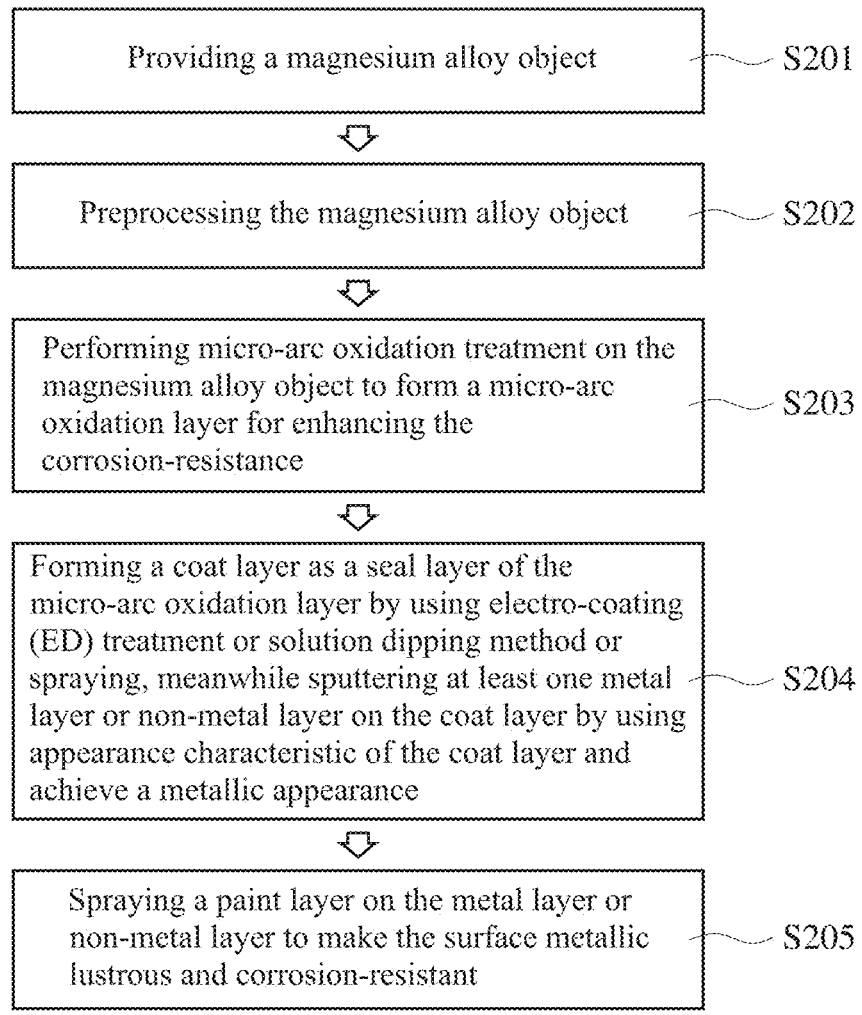
FIG. 3 shows the treatment steps according to the second embodiment of the present invention.

Refer to FIG. 3, the step in the second embodiment of the present invention provides a surface treatment method for magnesium alloy object, the method comprising: providing a magnesium alloy object (S201). Preprocessing the magnesium alloy object (S202). Performing micro-arc oxidation (MAO) treatment on the magnesium alloy object to form a micro-arc oxidation layer (S203). Forming a coat layer as a seal layer of the micro-arc oxidation layer by using electrocoating (ED) treatment or solution dipping method or spraying, meanwhile sputtering at least one metal layer or non-metal layer on the paint layer by using appearance characteristic of the coat layer to achieve a metallic appearance (S204); Spraying a paint layer on the metal layer or non-metal layer to make the surface metallic lustrous and corrosion-resistant (S205).

Wherein the preprocessing step comprises removing the dust particle and oil stain.

Wherein the micro-arc oxidation layer can be a passivation layer for enhancing the capability of corrosion-resistance. Meanwhile, the surface of the micro-arc oxidation layer can be an imitation-aluminum alloy surface. The surface of the micro-arc oxidation layer has irregular holes with surface roughness Ra 0.5~2 um.

Wherein the metal layer includes aluminum/stainless steel/titanium. The non-metal layer includes titanium oxide, titanium oxynitride or silicon oxide.

Wherein the coat layer can be formed by stereoscopic particle spraying method, such as spraying sand paint. Namely, sputtering the metal layer on the coat layer and sputtering the non-metal layer on the metal layer. Alternatively, sputtering the metal layer or non-metal layer on the coat layer.

Wherein a solution in the solution dipping method can be a Water-based siloxane resin.

Wherein the paint layer 15 can be a resin which has ability to enhance the corrosion resistance/scratch resistance. The paint layer can be a transparent or matte paint layer or anti-glare layer (AG layer). The transparent paint layer includes ability of anti-fingerprint or organic paint in order to protect the sputtering layer.

In one embodiment, one of the metal layer and the non-metal layer in the present invention is arranged on the micro-arc oxidation layer.

In one embodiment, the metal layer and the non-metal layer in the present invention are arranged on the micro-arc oxidation layer in sequence.

In one embodiment, the non-metal layer and the non-metal layer in the present invention are arranged on the micro-arc oxidation layer.

In one embodiment, the metal layer and the metal layer in the present invention are arranged on the micro-arc oxidation layer.

Figure 4:
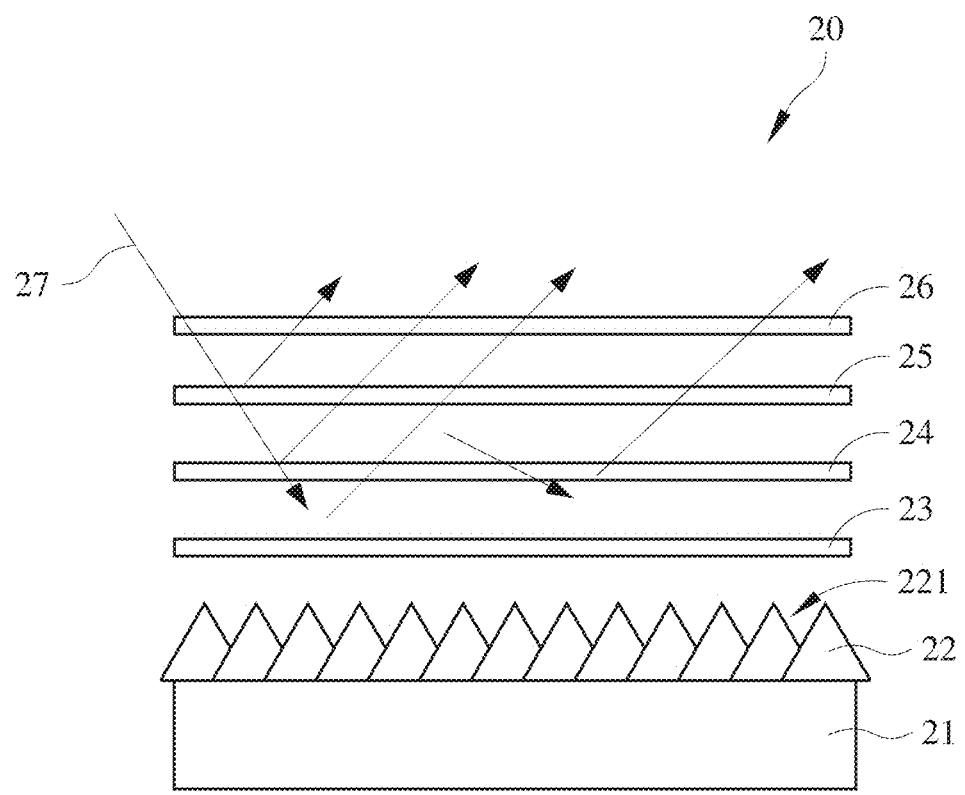
FIG. 4 shows the view of structure according to the second embodiment of the present invention.

Refer to FIG. 4, the second embodiment of the present invention further provides a surface structure 20 of magnesium alloy object, comprising: a substrate 21, a micro-arc oxidation layer 22 arranged on the substrate 21, the micro-arc oxidation layer 22 has an rough surface 221; at least one metal layer 24 or at least one non-metal layer 25 is arranged on the micro-arc oxidation layer 22, and a coat layer 23 arranged on the metal layer 24 or non-metal layer 25, a paint layer 26 arranged on the coat layer 23.

Wherein, the substrate 21 is a magnesium alloy object.

Wherein the micro-arc oxidation layer 22 can be a passivation layer for enhancing the capability of corrosion-resistance. Meanwhile, the surface of the micro-arc oxidation layer 22 can be an imitation-aluminum alloy surface. The surface 221 of the micro-arc oxidation layer 22 has irregular holes with surface roughness Ra 0.5~2 um.

Wherein the coat layer 23 is formed by using electrocoating (ED) treatment or spraying.

Wherein the metal layer or non-metal layer which is sputtered on the micro-arc oxidation layer 22 has different reflect angles when a light source 27 is projected thereon, and the different reflect angles are 0~180 degrees.

Wherein the metal layer 24 includes aluminum/stainless steel/titanium. The non-metal layer 25 includes titanium oxide, titanium oxynitride or silicon oxide.

Wherein the paint layer 26 can be a resin which has ability to enhance the corrosion resistance/scratch resistance. The paint layer can be a transparent or matte paint layer or anti-glare layer (AG layer). The transparent paint layer includes ability of anti-fingerprint or organic paint in order to protect the sputtering layer.

In one embodiment, one of the metal layer 24 and the non-metal layer 25 in the present invention is arranged on the micro-arc oxidation layer 22.

In one embodiment, the metal layer 24 and the non-metal layer 25 in the present invention are arranged on the micro-arc oxidation layer 22 in sequence.

In one embodiment, the non-metal layer 25 and the non-metal layer 25 in the present invention are arranged on the micro-arc oxidation layer.

In one embodiment, the metal layer 24 and the metal layer 24 in the present invention are arranged on the micro-arc oxidation layer 22.

The magnesium alloy object according to the present invention is subject to the surface with metallic gross by arranging the metal layer, the non-metal layer and transparent or matte paint layer on the micro-arc oxidation layer after micro-arc oxidation (MAO) treatment, and can achieve corrosion protection. Moreover, the surface of the magnesium alloy object is passivated and the passivated surface still has metallic gross.

Although the present invention has been described with reference to the preferred embodiment thereof, it will be understood that the present invention is not limited to the details thereof. Various substitutions and modifications have been suggested in the foregoing description, and others will occur to those of ordinary skill in the art. Therefore, all such substitutions and modifications are intended to be embraced within the scope of the present invention as defined in the appended claims.

What is claimed is:

1. A surface structure of a magnesium alloy object, comprising:
    a substrate;
    a micro-arc oxidation layer arranged on the substrate, wherein the micro-arc oxidation layer has a rough surface;
    a metal layer or non-metal layer arranged on the micro-arc oxidation layer; and
    a paint layer arranged on the metal layer or non-metal layer,
    wherein the rough surface of the micro-arc oxidation layer has irregular holes with surface roughness Ra 0.5-2 um.

2. The surface structure of a magnesium alloy object in claim 1, wherein the metal layer includes aluminum/stainless steel/titanium, the non-metal layer includes titanium oxide, titanium oxynitride or silicon oxide.

3. The surface structure of a magnesium alloy object in claim 1, wherein the paint layer is resin.

4. A surface structure of a magnesium alloy object, comprising:
    a substrate;
    a micro-arc oxidation layer arranged on the substrate, wherein the micro-arc oxidation layer has a rough surface;
    a coat layer arranged on the micro-arc oxidation layer, at least one metal layer or at least one non-metal layer arranged on the coat layer; and
    a paint layer arranged on the metal layer or non-metal layer,
    wherein the rough surface of the micro-arc oxidation layer has irregular holes with surface roughness Ra 0.5-2 um.

5. The surface structure of a magnesium alloy object in claim 4, wherein the coat layer is formed by electro-coating treatment or solution dipping method or spraying.

6. The surface structure of a magnesium alloy object in claim 4, wherein the metal layer includes aluminum/stainless steel/titanium, the non-metal layer includes titanium oxide, titanium oxynitride or silicon oxide.

7. The surface structure of a magnesium alloy object in claim 4, wherein the paint layer is resin.

* * * * *